(12) United States Patent
Morita et al.

(10) Patent No.: US 8,067,907 B2
(45) Date of Patent: Nov. 29, 2011

(54) CHARGED PARTICLE ACCELERATOR

(75) Inventors: Hiroshi Morita, Mito (JP); Ryozo Takeuchi, Hitachi (JP); Toshiyuki Yokosuka, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 354 days.

(21) Appl. No.: 12/388,135

(22) Filed: Feb. 18, 2009

(65) Prior Publication Data
US 2009/0224701 A1 Sep. 10, 2009

(30) Foreign Application Priority Data

Feb. 18, 2008 (JP) .................................. 2008-035441

(51) Int. Cl.
*H05H 9/00* (2006.01)
(52) U.S. Cl. ........................................ 315/500; 315/506
(58) Field of Classification Search .................. 315/506, 315/500, 501, 505
See application file for complete search history.

(56) References Cited

U.S. PATENT DOCUMENTS

| 3,694,689 | A | * | 9/1972 | Odenthal et al. | ................... | 315/3 |
| 4,879,518 | A | * | 11/1989 | Broadhurst | ................... | 315/506 |
| 2008/0224064 | A1 | | 9/2008 | Morita et al. | | |

FOREIGN PATENT DOCUMENTS

| JP | 03-133100 | 6/1991 |
| JP | 06-176621 | 6/1994 |
| JP | 06-203996 | 7/1994 |
| JP | 10-013102 | 1/1998 |
| JP | 10-092363 | 4/1998 |
| JP | 2001-099995 | 4/2001 |
| JP | 2007-179888 | 7/2007 |
| JP | 2008-226683 | 9/2008 |
| JP | 2008-262713 | 10/2008 |

OTHER PUBLICATIONS

Japanese Office Action issued in Japanese Patent Application No. JP 2008-035441 dated Apr. 13, 2010.
Japanese Office Action issued in Japanese Patent Application No. JP 2010-115882 dated Aug. 3, 2010.

* cited by examiner

*Primary Examiner* — David Hung Vu
(74) *Attorney, Agent, or Firm* — McDermott Will & Emery LLP

(57) ABSTRACT

In a charged particle accelerator, voltage of several tens of kV is applied between accelerating electrodes. In such a case, electric discharge is sometimes generated between the accelerating electrodes. In the charged particle accelerator, part or entirety of the accelerating electrodes is coated with an electric discharge suppressing layer made of ceramics or alloy having a high melting point as compared with metal. When impurity fine particles are accelerated by an electric field and collide with the electrodes, the electric discharge suppressing layer made of ceramics or alloy prevents metal vapor from being easily generated from the electrodes and an ionized plasma from being easily produced, thus suppressing electric discharge between the electrodes.

3 Claims, 4 Drawing Sheets

CHARGED PARTICLE ACCELERATOR

BACKGROUND OF THE INVENTION

1. Field of the Invention

The present invention relates to a charged particle accelerator that prevents electrical discharge.

2. Description of the Related Art

An accelerating tube has a structure in which electrodes (accelerating electrodes) of multi-stages are stacked and voltage of several tens of kV is applied between the accelerating electrodes. Thus, in some cases, dust, residual gas, charging and the like cause electric discharge between the stacked electrodes. Generation of electric discharge temporarily reduces voltage and results in unstable applied voltage. Particularly, under a vacuum condition, an electron is emitted from an electrode with a low potential and collides with an electrode with a high potential, so that metal of the electrode is evaporated in vacuum to degrade insulation properties between the electrodes, thereby leading to large-scale electric discharge. Generation of electric discharge makes it impossible to apply voltage to the accelerating tube, so that the entire system is stopped. Japanese Unexamined Patent Application Publication No. Hei 6-203996 discloses that accelerating electrodes are used as magnets to generate lines of magnetic force around the electrodes so as to prevent electric discharge of the entire accelerating tube.

SUMMARY OF THE INVENTION

When the accelerating electrodes are used as magnets to generate lines of magnetic force around the electrodes, its magnetic field adversely affects an orbit of accelerated particles. Accordingly, an object of the present invention is to prevent electric discharge between the electrodes without affecting an orbit of accelerated particles and improve reliability of the entire system having a charged particle accelerator.

The present invention has been made to solve the aforementioned problem and the solving means is described below. The feature of the present invention lies in a charged particle accelerator in which part or entirety of the accelerating electrodes is coated with an electric discharge suppressing layer made of ceramics or alloy having a high melting point as compared with metal. When impurity fine particles are accelerated by an electric field and collide with electrodes, the electric discharge suppressing layer made of ceramics or alloy prevents metal vapor from being easily generated from the electrodes and an ionized plasma from being easily produced, thus allowing electric discharge between the electrodes to be suppressed.

Particularly, the feature of the present invention lies in a charged particle accelerator in which an electric field is generated by multiple accelerating electrodes, to which voltage held in vacuum is applied, so as to accelerate charged particles. Part or entirety of an outer part of each electrode, made of a metal or alloy, is enclosed with an electric discharge suppressing layer made of ceramics containing $Al_2O_3$ whose mass ratio is 80% or more. Part or entirety of the electrode is enclosed with the electric discharge suppressing layer made of ceramics having a high melting point as compared with metal, whereby vapor is hardly generated from the electrode when impurity fine particles (clump) collide with the electrode, thus allowing electric discharge to be suppressed.

It is preferable that the ceramics contain $TiO_2$ or TiC whose mass ratio should be 1% or more to 20% or less. Mixture of $TiO_2$ or TiC into the ceramics, which encloses the electrode, allows resistivity of the ceramics to be reduced, thus decreasing the electric field around the clump adhered to the surface of the ceramics. As a result, electrostatic force is reduced, which accelerates the clump that causes electric discharge, thus suppressing separation of the clump.

Another feature of the present invention lies in a charged particle accelerator in which an electric field is generated by multiple accelerating electrodes, to which voltage held in vacuum is applied, to accelerate charged particles. Part or entirety of each electrode is enclosed with an electric discharge suppressing layer made of an alloy containing Ti whose mass ratio is 85% or more. Part or entirety of the electrode is enclosed with an alloy having a high melting point as compared with general metal, whereby vapor is hardly generated from the electrode when a clump collides with the electrode, thus allowing electric discharge to be suppressed. It should be noted that an alloy containing Ti whose mass ratio is 85% or more may be used as an electrode itself to allow the electric discharge suppressing layer and the electrode to be integrated.

It is preferable that electrical resistivity of the electric discharge suppressing layer should be set to $10^8$ Ω*cm or more and $10^{15}$ Ω*cm or less. The electrical resistivity of the electric discharge suppressing layer is set to $10^8$ Ω*cm or more and $10^{15}$ Ω*cm or less, thereby sufficiently decreasing the electric field around the clump adhered to the surface of the electric discharge suppressing layer. As a result, electrostatic force is reduced, which accelerates the clump that causes electric discharge, thus suppressing separation of the clump.

The charged particle accelerator includes an accelerating tube, a cyclotron, a synchrotron, a betatron, or the like, and the present invention is useful in any apparatus. These charged particle accelerators are used in electron microscope, nuclear physics laboratory equipment, cancer treatment equipment, synchrotron radiation equipment, and the like.

According to the present invention, it is possible to achieve an accelerating tube having high reliability in which electric discharge is hardly generated.

DESCRIPTION OF THE PREFERRED EMBODIMENTS

Hereinafter, the present invention is described further in detail.

Figure 1:
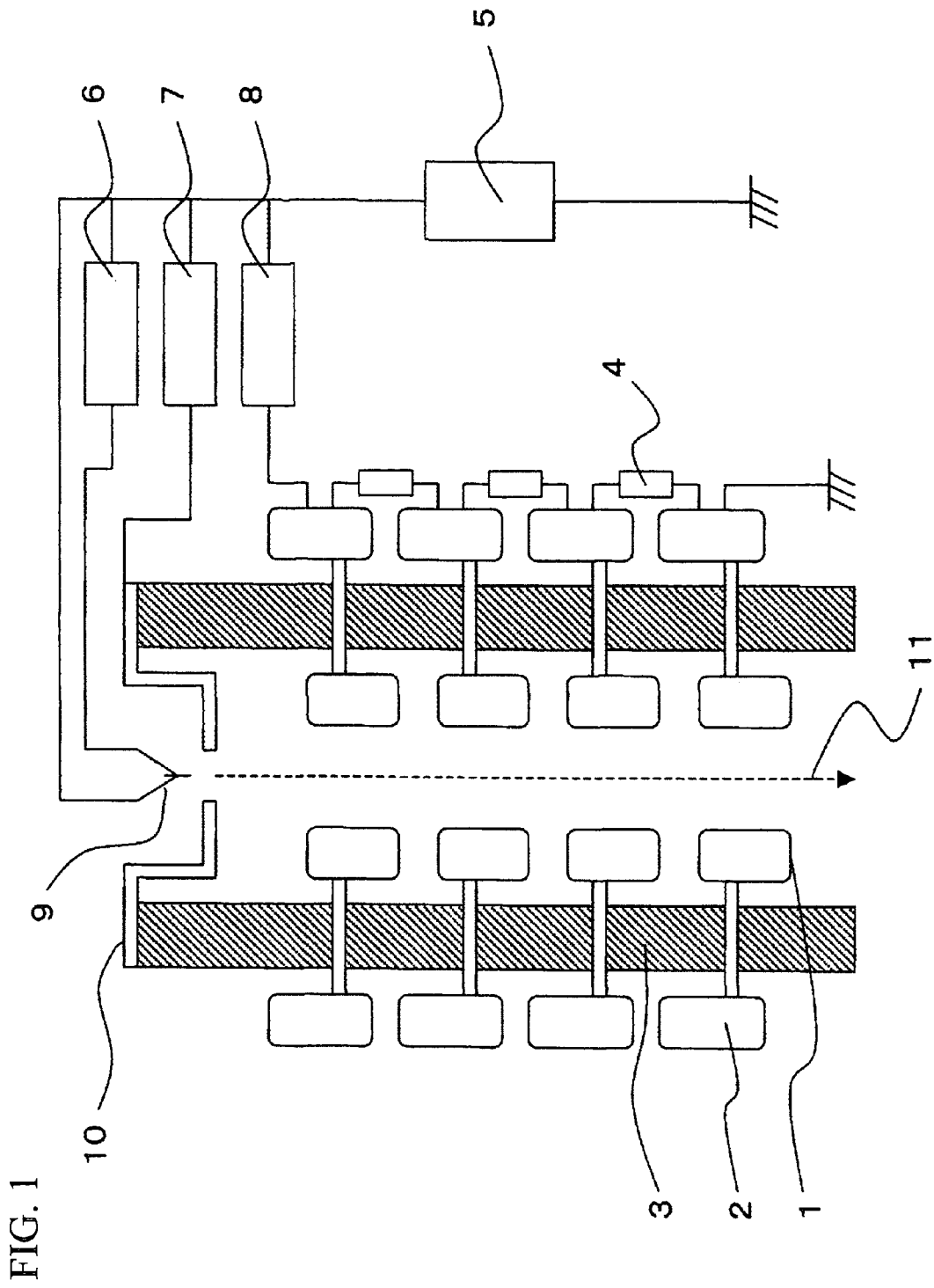
FIG. 1 is a view illustrating a structural example of an accelerating tube.

FIG. 1 illustrates an example of a structure of an accelerating tube. The accelerating tube has a structure in which accelerating electrodes, each of which includes a ring-shaped inner electrode 1 and outer electrode 2, and insulating tubes 3 are stacked in multiple stages. The inner electrode 1 and the outer electrode 2 are connected by a conductor and both the electrodes are maintained at the same potential. An extractor power supply 8, which extracts an electron from a cathode, and an accelerating power supply 5 are connected to the accelerating electrode of the uppermost stage so as to apply a high DC voltage thereto. Accelerating electrodes are connected through a divided resistance 4 and the accelerating electrode of the final stage is at ground potential. Such arrangement of accelerating electrodes generates an electric field in a central portion of the ring-shaped accelerating tube in a direction perpendicular to the accelerating electrodes (direction where the accelerating electrodes are stacked).

An electron gun is mounted on the uppermost stage of the accelerating tube. Although a thermionic-emission electron gun is illustrated in FIG. 1, any type of electron gun may be mounted thereon. The electron gun includes a cathode 9 and an anode 10 and a heating power supply 6 is connected to the cathode 9, and the cathode 9 is heated by current from the heating power supply 6. When voltage is applied between the cathode 9 and the anode 10 by an extraction voltage generating power supply 7 with the cathode 9 heated, an electron beam is emitted from the cathode 9.

A voltage of, for example, 200 kV is applied between the uppermost stage of the accelerating electrode and the lowermost stage thereof, and voltage of several tens of kV is shared between the accelerating electrodes. By the aforementioned structure, the electron beam emitted from the electron gun is accelerated.

The outer electrode 2 can ensure insulation withstand voltage by filling its surrounding with an insulating gas such as $SF_6$, while the inner electrode 1 is held in vacuum, and therefore vacuum discharge is easily generated in the inner electrode 1 as compared with the outer electrode 2.

Regarding the mechanism of electric discharge in vacuum, various theories are presented and a clump theory is one of them. A clump (impurity fine particles) adhered to the surface of the electrode is separated from the electrode by electrostatic force. In this case, when the clump is accelerated by interelectrode voltage and collides with a counter electrode, kinetic energy is converted into heat energy and the counter electrode or clump emits metal vapor. The metal vapor is converted into ionized plasma by electron impact to generate electric discharge between the electrodes. The clump theory is specifically explained in "Electric Discharge Handbook" (issued by the Institute of Electric Engineers of Japan). An electric discharge suppressing layer is provided in the electrode and a Ti alloy is used as the electrode as in the present invention, thereby preventing electric discharge due to the clump.

Figure 2:
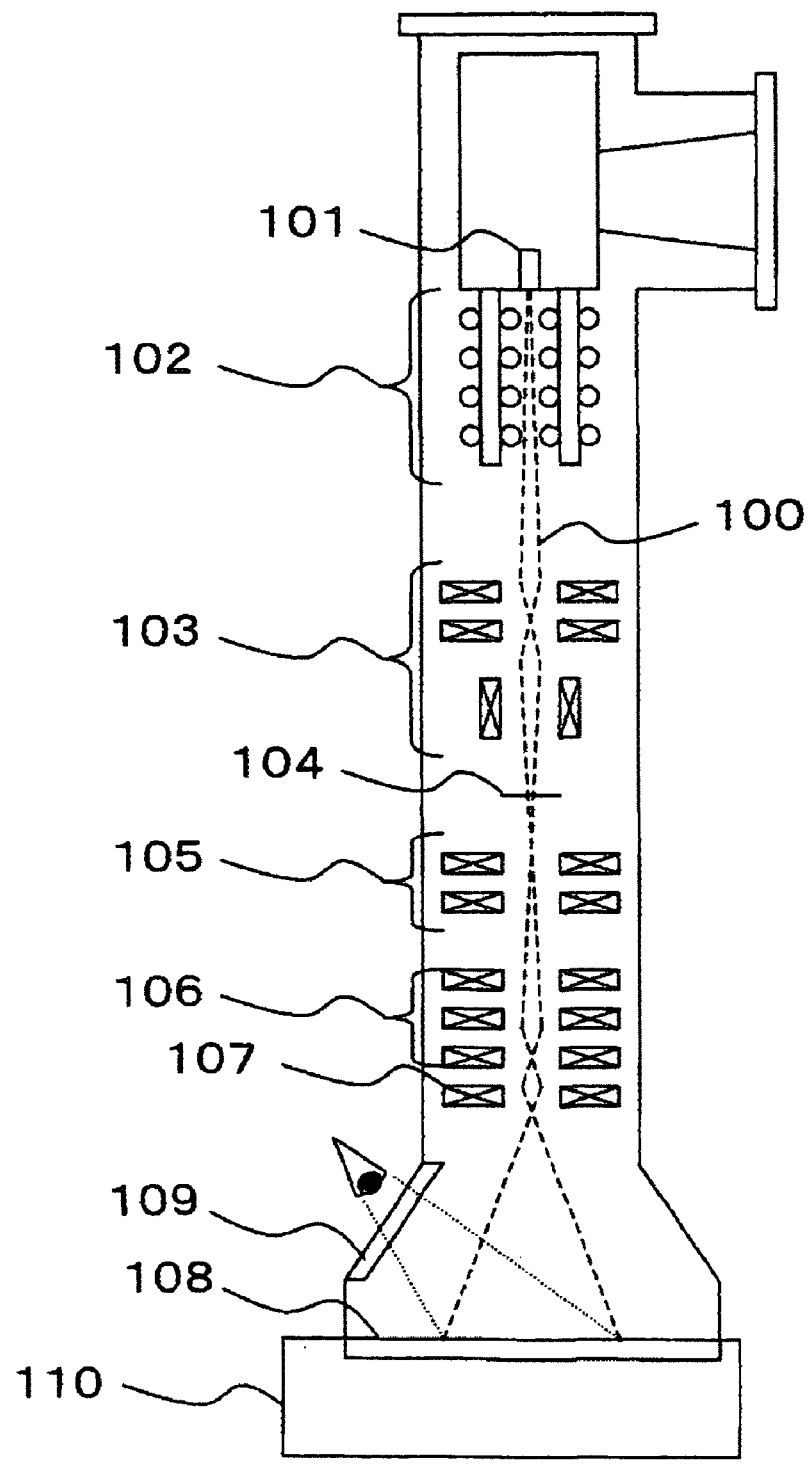
FIG. 2 is a view illustrating an example of a charged particle accelerator.

FIG. 2 illustrates a schematic structural example of a transmission electron microscope having charged particle accelerators (hereinafter referred to as accelerating tubes). An electron gun 101 accelerates electrons emitted from a cathode by an anode and emits electron beams. The electron gun includes a thermionic-emission electron gun, a cold field-emission electron gun, a thermal field-emission gun, or the like. Accelerating tubes 102 sequentially accelerate the electron beams emitted from the electron gun up to necessary energy. In an electron microscope operated at, for example, 200 kV, acceleration is performed with accelerating electrodes of six to seven stages stacked. A magnetic field is generated, and an electron beam 100 is converged and radiated on a specimen by condenser lenses 103. The electron beam 100 is diffracted when transmitting through a specimen 104. The diffracted electrons form an image on objective lenses 105. Intermediate lenses 106 adjust exciting current to change their focal distances so as to bring diffraction patterns formed by the objective lenses into focus. Moreover, diffraction patterns are magnified and image formed on an object surface of a projection lens 107. The projection lens 107 is a final lens of an imaging lens system and further magnifies the image magnified by the intermediate lenses 106, and forms an image on a fluorescent screen 108. The formed image can be observed from an observation window 109. Moreover, the image can be photographed by a camera installed in a camera room 110.

First Embodiment

Figure 3:
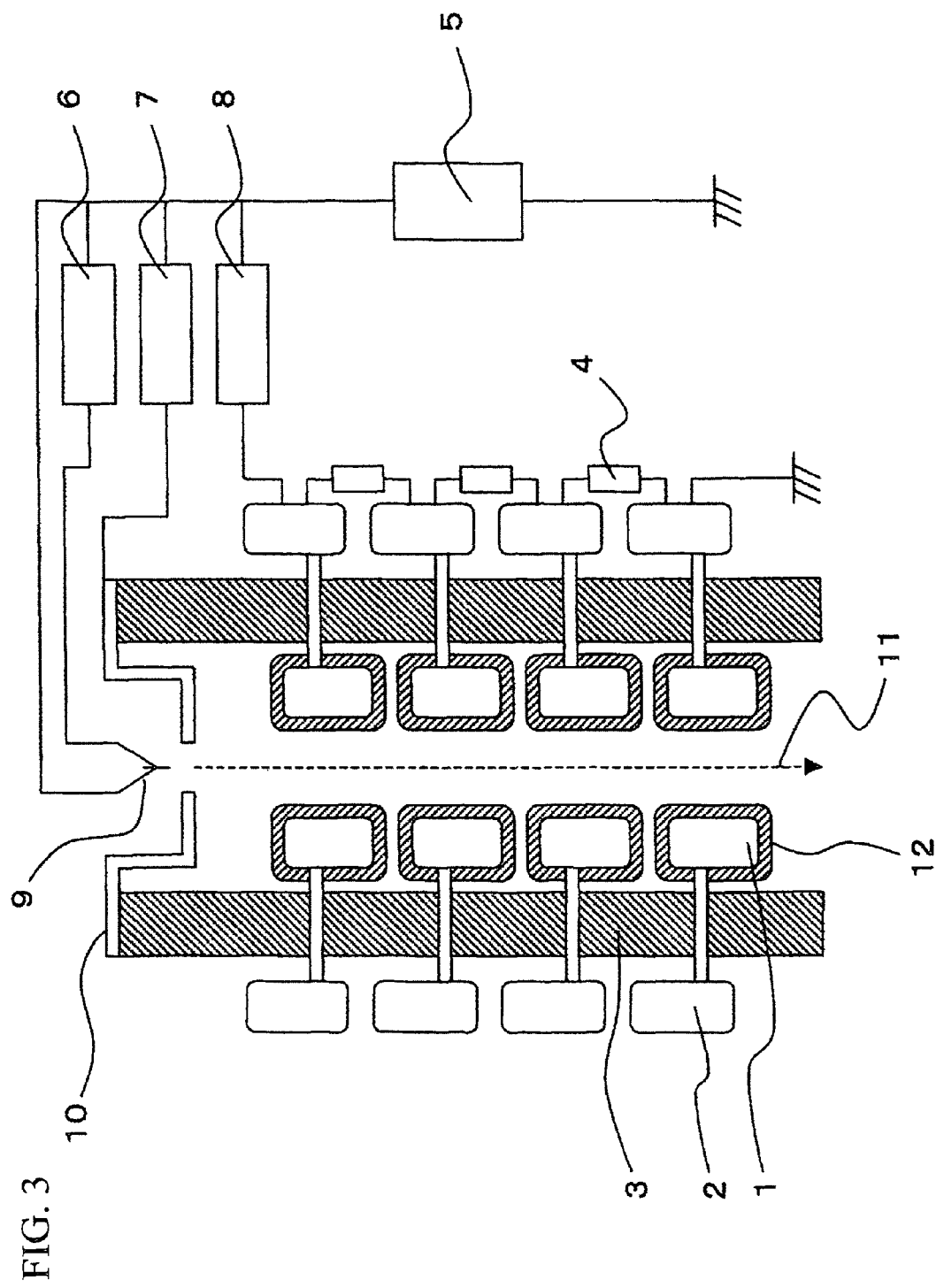
FIG. 3 is a view illustrating an accelerating tube using accelerating electrodes, each of which is coated with ceramics according to a first embodiment of the present invention.

The first embodiment explains an example of an accelerating tube in which electrodes are coated with ceramics containing alumina by use of FIG. 3. In this embodiment, a structure is provided in which the entire surrounding of each of the inner electrodes 1 is coated with ceramics 12 containing $Al_2O_3$ of 80 wt % or more. As the electrode, metal such as iron, stainless, copper, aluminum is exemplified. Thus, part or entirety of the electrode is enclosed with the ceramics 12 having a high melting point as compared with the metal, whereby vapor is hardly generated from the electrode when a clump collides with the electrode, thus allowing electric discharge to be suppressed. Moreover, in this embodiment, although the structure is provided in which the entire surrounding of the inner electrode 1 is coated with a ceramics layer containing alumina, a structure may be possible in which the part thereof is coated therewith. In this case, it is desirable that a ceramics layer should be formed so as to cover a surface facing at least an adjacent electrode.

Second Embodiment

A second embodiment explains an example of an accelerating tube in which each electrode is coated with alumina containing titania ($TiO_2$) as a ceramics layer, similar to the first embodiment. The structure of the accelerating tube of this embodiment is substantially the same as that illustrated in FIG. 3, and alumina containing $TiO_2$ of 1 wt % or more and 20 wt % or less is used as the layer of ceramics 12.

Thus, mixture of $TiO_2$ into the ceramics 12, which encloses the electrode, allows resistivity of the ceramics 12 to be reduced. Moreover, mixture of titania into the alumina allows resistivity of the alumina to be reduced to about $\frac{1}{100}$ at the maximum. When a clump adheres to the surface of the ceramics, the reduction in resistivity of the ceramics 12 makes it possible to decrease an electric field of its surrounding. This also reduces the electrostatic force which accelerates the clump that causes electric discharge, thus suppressing electric discharge due to separation of the clump. Particularly, it is preferable that the electrical resistivity of the ceramics 12 should be set to $10^8$ Ω*cm or more and $10^{15}$ Ω*cm or less. Even in a case of ceramics other than that of this embodiment, the electrical resistivity is set to $10^8$ Ω*cm or more and $10^{15}$ Ω*cm or less, whereby a high effect, which is the same as that of ceramics where titania is mixed into alumina, can be expected.

A portion where the ceramics 12 is provided may be part of the electrode, and particularly, it is useful to provide the ceramics 12 on a portion facing the adjacent electrode.

Third Embodiment

The third embodiment explains an example of an accelerating tube in which each electrode is coated with alumina containing TiC as a ceramics layer, similar to the first embodiment. The structure of the accelerating tube of this embodiment is substantially the same as that illustrated in FIG. 3, and alumina containing TiC of 1 wt % or more and 20 wt % or less is used as the layer of ceramics 12.

Mixture of TiC into the ceramics 12 allows resistivity of the ceramics 12 to be reduced. When a clump is adhered to the surface of the ceramics, the reduction in resistivity of the ceramics 12 makes it possible to decrease an electric field of its surrounding. This reduces electrostatic force which accelerates the clump that causes electric discharge, thereby suppressing electric discharge due to separation of the clump. Particularly, it is preferable that the electrical resistivity of the ceramics 12 should be set to $10^8$ Ω*cm or more and $10^{15}$ Ω*cm or less. Even in a case of ceramics other than that of this embodiment, the electrical resistivity is set to $10^8$ Ω*cm or more and $10^{15}$ Ω*cm or less, whereby a high effect, which is the same as that of ceramics in which titania is mixed into alumina, can be expected.

A portion where the ceramics 12 is provided may be part of the electrode, and particularly, it is useful to provide the ceramics 12 on a portion facing the adjacent electrode.

Fourth Embodiment

Figure 4:
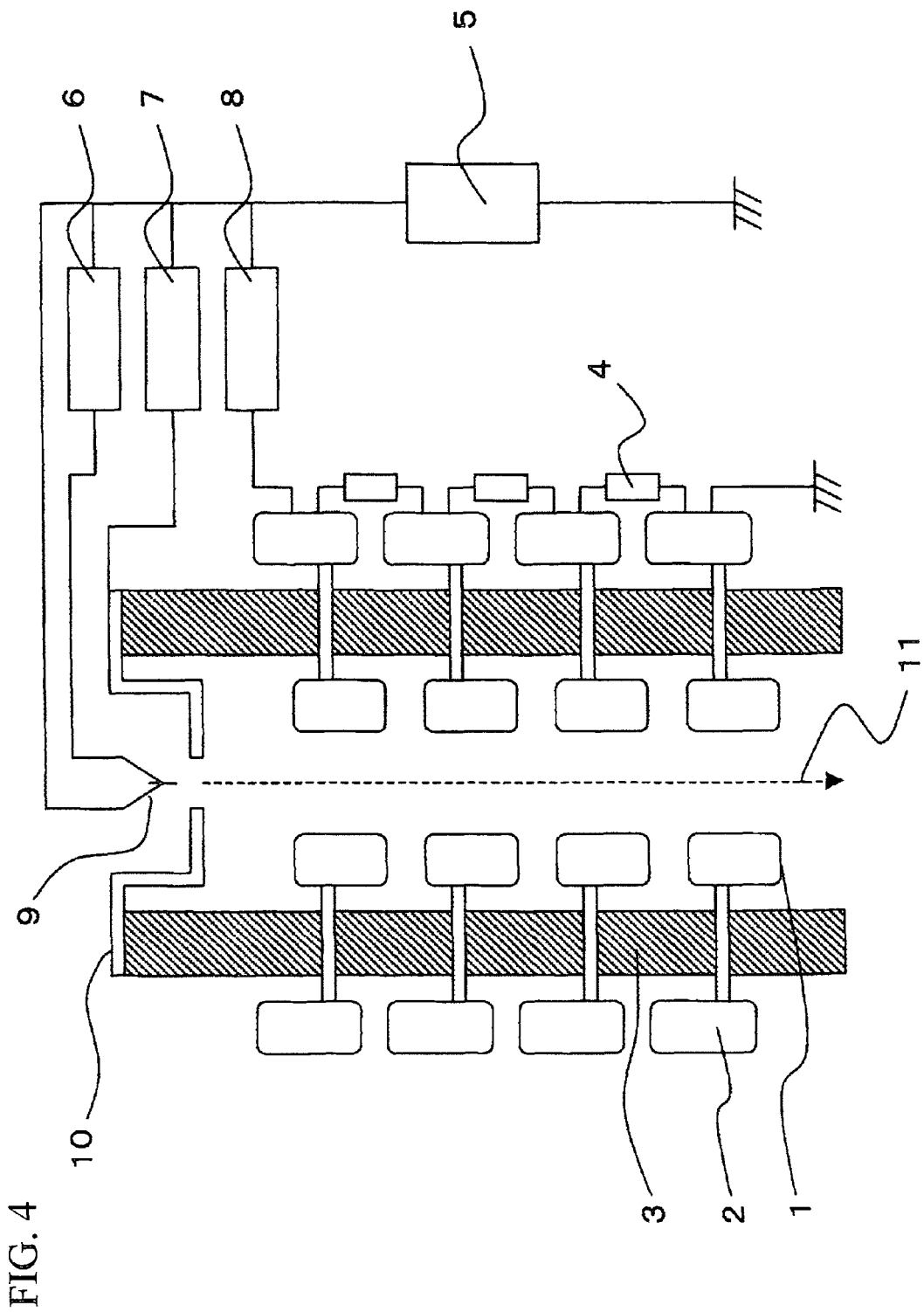
FIG. 4 is a view illustrating an accelerating tube in which each accelerating electrode is formed of an alloy containing Ti according to a fourth embodiment of the present invention.

A fourth embodiment explains an example of an accelerating tube in which an alloy containing Ti is used as an inner electrode with reference to FIG. 4. An apparatus structure is substantially the same as that of FIG. 1 and is characterized in that the alloy containing Ti is used as the inner electrode 1. The alloy containing Ti has a melting point higher than that of the electrode, which is formed of general metal (electrode made of iron, copper, aluminum, stainless, or the like), and using this kind of electrode prevents vapor from being easily generated from the electrode when the clump collides with the electrode, thus allowing electric discharge to be suppressed. For example, an alloy, which contains aluminum of 6%, vanadium of 4% and titanium of 90% (generally called 6-4 titanium) is given as a titanium alloy.

Moreover, the same effect can be obtained by covering part or entire surface of the electrode with an alloy containing Ti.

EXPLANATION OF REFERENCE NUMERALS

1 . . . inner electrode, 2 . . . outer electrode, 3 . . . insulating tube, 4 . . . divided resistance, 5 . . . accelerating power supply, 6 . . . heating power supply, 7 . . . extraction voltage generating power supply, 8 . . . extractor power supply, 9 . . . cathode, 10 . . . anode, 11 . . . electron orbit, 12 . . . ceramics, 100 . . . electron beam, 101 . . . electron gun, 102 . . . accelerating tube, 103 . . . convergent lens, 104 . . . specimen, 105 . . . objective lens, 106 . . . intermediate lens, 107 . . . projection lens, 108 . . . fluorescent screen, 109 . . . observation window, 110 . . . camera room.

What is claimed is:

1. A charged particle accelerator that accelerates a charged particle, comprising:
   a plurality of accelerating electrodes that receive voltage to generate an electric field, wherein
   each of the accelerating electrodes is made of a metal or alloy,
   at least part of the accelerating electrodes is coated with an electric discharge suppressing layer, and
   the electric discharge suppressing layer is made of ceramics containing $Al_2O_3$ of 80 wt % or more.

2. The charged particle accelerator according to claim 1, wherein the electric discharge suppressing layer contains any of $TiO_2$ and TiC of 1 wt % or more and 20 wt % or less.

3. The charged particle accelerator according to claim 1, wherein electrical resistivity of the electric suppressing layer is $10^8$ Ω*cm or more and $10^{15}$ Ω*cm or less.

* * * * *